US008022547B2

(12) United States Patent
Vaithyanathan et al.

(10) Patent No.: US 8,022,547 B2
(45) Date of Patent: Sep. 20, 2011

(54) NON-VOLATILE MEMORY CELLS INCLUDING SMALL VOLUME ELECTRICAL CONTACT REGIONS

(75) Inventors: Venugopalan Vaithyanathan, Bloomington, MN (US); Wei Tian, Bloomington, MN (US); Insik Jin, Eagan, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 100 days.

(21) Appl. No.: 12/272,871

(22) Filed: Nov. 18, 2008

(65) Prior Publication Data

US 2010/0123542 A1 May 20, 2010

(51) Int. Cl.
*H01L 23/48* (2006.01)
*H01L 23/52* (2006.01)
*H01L 29/40* (2006.01)
*H01L 27/10* (2006.01)
*H01L 29/74* (2006.01)

(52) U.S. Cl. .......... 257/758; 257/211; 257/E21.575; 257/E21.576; 257/E21.627; 257/E21.641

(58) Field of Classification Search .......... 257/211, 257/758, E21.575, E21.576, E21.627, E21.641
See application file for complete search history.

(56) References Cited

U.S. PATENT DOCUMENTS

| | | | | |
|---|---|---|---|---|
| 6,472,754 B2 * | 10/2002 | Nakajima et al. | .......... | 257/758 |
| 6,759,263 B2 | 7/2004 | Ying | | |
| 7,138,718 B2 * | 11/2006 | Ahn et al. | .......... | 257/762 |
| 7,211,494 B2 * | 5/2007 | Danzl | .......... | 438/382 |
| 7,220,665 B2 * | 5/2007 | Farrar | .......... | 438/622 |
| 7,256,498 B2 * | 8/2007 | Huang et al. | .......... | 257/758 |
| 7,396,759 B1 * | 7/2008 | van Schravendijk et al. | .. | 438/625 |
| 7,453,085 B2 * | 11/2008 | Chang et al. | .......... | 257/41 |
| 7,465,981 B2 * | 12/2008 | Abe | .......... | 257/306 |
| 7,550,788 B2 * | 6/2009 | Ogawa | .......... | 257/209 |
| 2003/0209805 A1 * | 11/2003 | Choi et al. | .......... | 257/758 |
| 2005/0243630 A1 * | 11/2005 | Hsu et al. | .......... | 365/222 |
| 2006/0170020 A1 * | 8/2006 | Ohta et al. | .......... | 257/295 |
| 2007/0029676 A1 * | 2/2007 | Takaura et al. | .......... | 257/758 |
| 2007/0054450 A1 | 3/2007 | Hong | | |
| 2007/0120210 A1 | 5/2007 | Yuan | | |
| 2007/0246762 A1 * | 10/2007 | Amo et al. | .......... | 257/296 |
| 2008/0246014 A1 | 10/2008 | Lung | | |
| 2010/0109085 A1 * | 5/2010 | Kim et al. | .......... | 257/364 |
| 2010/0109107 A1 | 5/2010 | Ahn | | |
| 2010/0110746 A1 | 5/2010 | Hutchinson | | |
| 2010/0110758 A1 | 5/2010 | Li | | |
| 2010/0117169 A1 | 5/2010 | Anderson | | |

OTHER PUBLICATIONS

G.W. Burr et al., Overview of Candidate Device Technologies for Storage-Class Memory, IBM J. Res. & Dev. 52, 4/5 (2008), 449-464.
Sawa, Resistive Switching in Transition Metal Oxides, Materials Today, vol. 11, No. 6 (Jun. 2008).

* cited by examiner

*Primary Examiner* — Ida M Soward
(74) *Attorney, Agent, or Firm* — Campbell Nelson Whipps LLC

(57) ABSTRACT

A non-volatile memory cell that includes a first electrode; a second electrode; and an electrical contact region that electrically connects the first electrode and the second electrode, the electrical contact region has a end portion and a continuous side portion, and together, the end portion and the continuous side portion form an open cavity, wherein the memory cell has a high resistance state and a low resistance state that can be switched by applying a voltage across the first electrode and the second electrode.

10 Claims, 8 Drawing Sheets

US 8,022,547 B2

NON-VOLATILE MEMORY CELLS INCLUDING SMALL VOLUME ELECTRICAL CONTACT REGIONS

BACKGROUND

Non-volatile memory includes resistive memory technologies include any memory that involves detection of bits based on a change in resistance state. The phenomenon causing the change in resistance can vary based on the particular kind of material and can be due to a wide variety of mechanisms, including but not limited to tunneling magnetoresistance, phase change, filamentary mechanisms or programmable metallization cells. Controlling the resistance change to make it less variable or more reproducible, i.e., have a constant current or a narrow distribution in current effect the resistance change of all resistive memory cells can provide a more reliable product.

BRIEF SUMMARY

Disclosed herein is a non-volatile memory cell that includes a first electrode; a second electrode; and an electrical contact region that electrically connects the first electrode and the second electrode, the electrical contact region has a end portion and a continuous side portion, and together, the end portion and the continuous side portion form an open cavity, wherein the memory cell has a high resistance state and a low resistance state that can be switched by applying a voltage across the first electrode and the second electrode.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
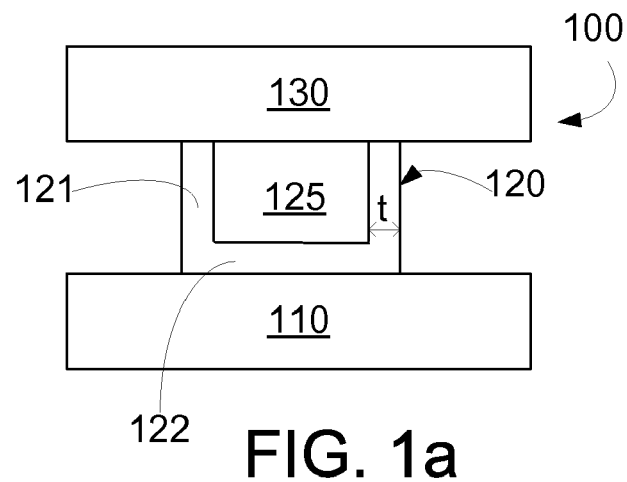
FIGS. 1a, 1b and 1c are cross sectional views of an embodiment of non-volatile memory cells having opposing configurations of the electrical contact region.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

Disclosed herein are non-volatile memory cells that include a first electrode, a second electrode and an electrical contact region that electrically connects the first electrode and the second electrode. The non-volatile memory cell has a high resistance state and a low resistance state that can be switched by applying a voltage across the first electrode and the second electrode. Switching the cell from a low resistance state to a high resistance state (referred to as resetting the cell) can be accomplished by a variety of methods, including breaking the continuity of filaments (whether conducting filaments in the case of filamentary RRAM and programmable metallization cells, phase change filaments or areas in the case of phase change memory or other types of filaments) across the non-volatile memory cell. The current necessary to break these filaments is regulated by the non-volatile memory cell itself and is directly proportional to the average size (e.g. diameter) of the filament and the number of filaments formed when the cell attained the low resistance state. In previously described non-volatile memory cells, the number and size of filaments formed and ultimately broken is not controllable and can result in large variation between reset currents required for switching non-volatile memory cells to a high resistance state. However, the non-volatile memory cells as disclosed herein offer the advantage of having more control over where filaments form and the dimensions of such filaments by limiting the area of electrical contact from one electrode to the other. This can ultimately lead to less variability in reset currents and also lower current requirements.

An exemplary non-volatile memory cell as disclosed herein is depicted in FIG. 1a. Non-volatile memory cells as disclosed herein can include resistive random access memory (RRAM) cells, programmable metallization cells (PMC) and phase change memory (PCM) cells. The exemplary non-volatile memory cell 100 includes a first electrode 110. The first electrode 110 can also be referred to as a bottom electrode or an active electrode. The first electrode can be, but is not necessarily formed on a substrate. The substrate, if utilized, can include any substrate commonly utilized to fabricate memory devices. Exemplary substrates include, but are not limited to, silicon, a mixture of silicon and germanium, and other similar materials.

The first electrode 110 can generally be a conductive material, such as a metal. In an embodiment, the first electrode can be an active electrode. The first electrode can be made of any conductive material, including but not limited to tungsten (W), tantalum (Ta), gold (Au), platinum (Pt), palladium (Pd), rhodium (Rh), copper (Cu), Nickel (Ni), Silver (Ag), Cobalt (Co), Iron (Fe) or titanium nitride (TiN). The first electrode 110 can also be made of oxides, such as ruthenium oxide ($RuO_2$), iridium oxide ($IrO_2$), indium tin oxide (ITO) or strontium ruthenate ($SrRuO_3$) for example. The first electrode can have a thickness as is commonly utilized. In an embodiment, the first electrode can have a thickness from about 50 Å to about 5000 Å.

A non-volatile memory cell as disclosed herein also includes a second electrode 130. The second electrode can also be referred to as a top electrode or an inert electrode. The second electrode 130 can generally be a conductive material, such as a metal. The second electrode 130 can be made of the same material as the first electrode 110 or a different material. In an embodiment, the second electrode can be an inert electrode. The second electrode can be made of any conductive material, including but not limited to, tungsten (W) or a noble metal such as gold (Au), platinum (Pt), palladium (Pd) or rhodium (Rh). The second electrode can have a thickness as is commonly utilized. In an embodiment, the second electrode 130 can have a thickness from about 50 Å to about 5000 Å.

A non-volatile memory cell as disclosed herein also includes an electrical contact region 120. The electrical contact region 120 functions to provide a path to electrically connect the first electrode (e.g. the bottom electrode) with the second electrode (e.g. the top electrode). In an embodiment, the electrical contact region 120 provides the only electrical connection between the first electrode 110 and the second electrode 130. In an embodiment, the electrical contact region 120 functions to provide a path to electrically connect the first electrode to the second electrode, where the path has a smaller volume than the electrical path in a RRAM cell as previously described. In an embodiment, the electrical contact region 120 provides a path having a volume that is not more than about 50% of the volume of a path as previously described. In an embodiment, the electrical contact region 120 provides a path having a volume that is not more than about 30% of the volume of a path as previously described. In an embodiment, the electrical contact region 120 provides a path having a volume that is not more than about 10% of the volume of a path as previously described.

In an embodiment, the electrical contact region 120 includes an end portion 122 and a continuous side wall portion 121. Together, the end portion 122 and the continuous side wall portion 121 form an open cavity 125. The electrical contact region can also have a similar configuration that does not include an end portion. Such an embodiment is depicted in FIG. 1c, where the first electrode 110 and the second electrode 130 are electrically connected through an electrical contact region 120 that includes only continuous side portion 121. Such an embodiment can afford smaller electrical contacts adjacent both the first electrode 110 and the second electrode 130, however, the active volume is substantially similar to that of FIG. 1a or 1b because the effective volume is generally the volume of continuous side wall portion.

The electrical contact region 120 can generally have any shaped configuration. In an embodiment, the electrical contact region 120 can have an annular shape. For example, the electrical contact region 120 can be similar to an open top hollow cylinder, as seen in FIGS. 1a, 1b, 2a and 2b. The electrical contact region 120 can also be similar to an open top and open bottom hollow cylinder, e.g. the sides of a cylinder in an embodiment without an end portion, as seen in FIG. 1c. In an embodiment, the electrical contact region 120 can have a hollow cuboid shape. For example, the electrical contact region 120 can be similar to an open top hollow rectangular cuboid or an open top hollow rectangular square cuboid, as seen in FIGS. 1a, 1b, 2a and 2b. The electrical contact region 120 can also be similar to an open and top bottom hollow rectangular cuboid or an open and top bottom hollow rectangular square cuboid, as seen in FIG. 1c. In an embodiment, the electrical contact region 120 can have a pyramidal shape (e.g. an open top hollow pyramid, not depicted in the figures).

In an embodiment, depicted in FIG. 1a, the electrical contact region 120 can be oriented so that the end portion 122 is disposed on or adjacent to the first electrode 110. In an embodiment, the electrical contact region 120 can be oriented so that the end portion 122 is disposed directly on or in contact with the first electrode 110.

Figure 1B:
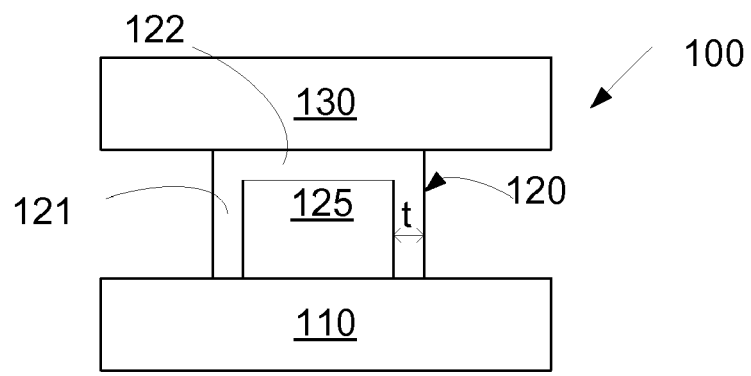
Figure 1C:
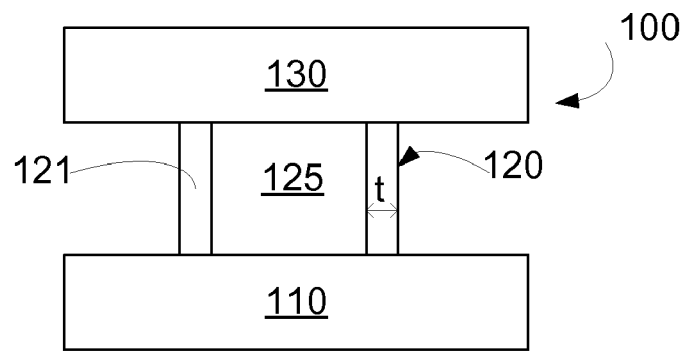

In an embodiment, depicted in FIG. 1b, the electrical contact region 120 can be oriented so that the open end of the cavity 125 (opposite the end portion 122) is disposed on or adjacent to the first electrode 110. In an embodiment, the electrical contact region 120 can be oriented so that the open end of the cavity 125 (opposite the end portion 122) is disposed directly on or in contact with the first electrode 110.

The electrical contact region 120 can be described as having a thickness. FIGS. 1a and 1b indicate the thickness of the electrical contact region 120 as t. In an embodiment, the continuous side wall portion 121 of the electrical contact region 120 can have the same thickness as the end portion 122 of the electrical contact region 120. In an embodiment, the continuous side wall portion 121 and the end portion 122 can have different thicknesses. In an embodiment, the continuous side wall portion 121, the end portion 122, or both can have a thickness from about 2 nanometers (nm) to about 50 nm. In an embodiment, the continuous side wall portion 121, the end portion 122, or both can have a thickness from about 5 nm to about 50 nm. In an embodiment, both the continuous side wall portion 121 and the end portion 122 can have substantially the same thickness, which can be from about 2 nm to about 50 nm.

The electrical contact region 120 can be formed of a conductive material or a memory material. In embodiments where the electrical contact region 120 is formed of a memory material, the electrical contact region 120 functions as both the electrical connection between the two electrodes and the material whose resistance changes in response to a voltage being passed across the electrodes. Therefore, such an embodiment does not require an additional layer of memory material, which would require less steps in fabrication. In embodiments where the electrical contact region 120 is formed of a conductive material, the electrical contact region 120 functions as the electrical connection from one electrode, through a layer of memory material to another electrode. Such an embodiment generally utilizes a layer of memory material (not shown in FIGS. 1*a* and 1*b*).

Embodiments where the electrical contact region 120 is formed of a memory material can offer advantages by reducing the volume of memory material as compared to non-volatile memory cells as previously described. By reducing the volume of memory material, the filament size, number of filaments or both that can form when the non-volatile memory cell is set to the low resistance state can be reduced, constrained or both. This can improve the functioning of the device by reducing the power necessary to reset the non-volatile memory cell to the high resistance state, render the power necessary to reset more constant, decrease the time necessary for resetting, or a combination thereof.

In an embodiment where the non-volatile memory cell includes an electrical contact region 120 that is formed of memory material, the memory material may be any material utilized in resistive random access memory (RRAM) cells, phase change memory (PCM), which is also referred to as PRAM, PCRAM and C-RAM; programmable metallization cell (PMC) which is also referred to as conductive-bridging RAM (CBRAM). Exemplary types of RRAM include, but are not limited to, filamentary RRAM. Materials for RRAM cells include, but are not limited to, oxides, such as perovskites and transition metal oxides, chalcogenides and nitrides. Exemplary oxides include, but are not limited to, chromium-doped strontium zirconate ($SrCr_xZr_{1-x}O_3$), chromium-doped strontium titanate ($SrCr_xTi_{1-x}O_3$), titanium doped nickel oxide ($Ti_xNi_{1-x}O$), copper oxides ($CuO_x$), silicon dioxide ($SiO_2$), hafnium oxide ($HfO_2$), undoped or doped zirconium oxide ($ZrO_2$), Titanium oxides ($TiO_x$) zinc oxide (ZnO) and gadolinium oxide ($Gd_2O_3$). Exemplary chalcogenides include, but are not limited to, germanium tellurium (GeTe), germanium sulfide (GeS), copper tellurium (CuTe), germanium selenide (GeSe), germanium antimonide (GeSb), and germanium antimony telluride (GST). Exemplary nitrides include, but are not limited to, aluminum nitride (AlN), silicon nitride (SiN), titanium oxy-nitride ($TiO_xN_y$), indium nitride (InN) and undoped or doped gallium nitride (GaN).

In an embodiment where the non-volatile memory cell includes electrical contact region 120 made of memory material, the memory material can be oxides, chalcogenides or nitrides mentioned above. For filamentary RRAM, it could be any of the transition metal oxides, for PCRAM or CBRAM, it could be any of the chalcogenides or oxide solid electrolyte.

In an embodiment where the memory material is a programmable metallization cell (PMC) material, a cell as disclosed herein can improve retention of data in the PMC. In a typical PMC memory cell, filaments are formed across the resistive solid electrolyte material by applying a voltage higher than the threshold voltage, thereby changing the resistance state from the high resistance state to the low resistance state. Migration or diffusion of ions in the idle state of a PMC cell in low resistance, results in retention issues, which can be a drawback to PMC-based non-volatile memory products. PMC cell design that includes a nano-dimensional electrical contact region as memory layer 120 as disclosed herein minimizes the available volume for the ions to migrate in the idle state, resulting in superior retention properties for the memory.

Figure 2A:
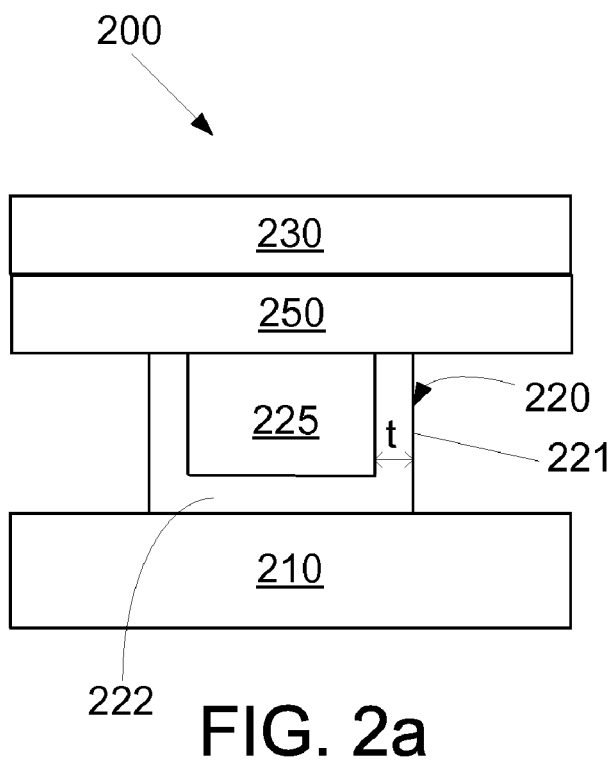
FIGS. 2a and 2b are cross sectional views of an embodiment of non-volatile memory cells that includes memory material layers and have opposing configurations of the electrical contact region.
Figure 2B:
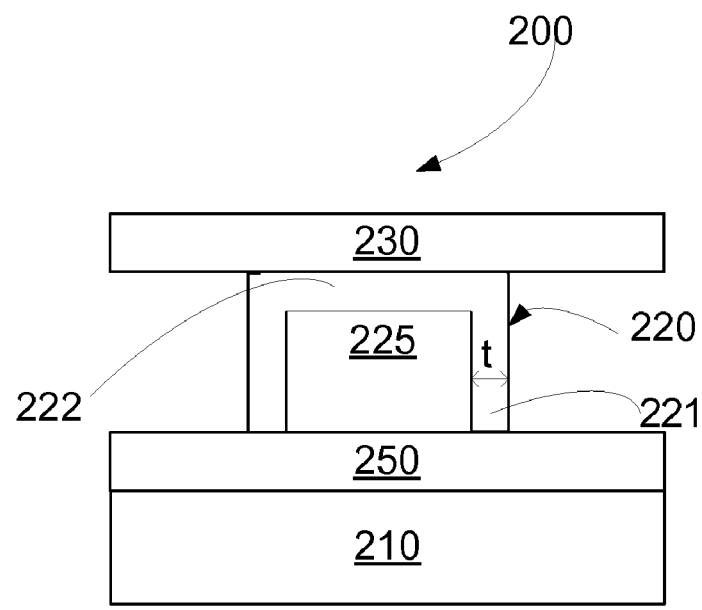

Another embodiment of a non-volatile memory cell as disclosed herein, is depicted in FIGS. 2*a* and 2*b*. Such an embodiment has an electrical contact region 220 that includes a conductive material. Embodiments as disclosed herein that include an electrical contact region 220 made of a conductive metal can offer advantages by minimizing filament nucleation locations by providing a reduced contact area for the first electrode 210 (FIG. 2*a*), the second electrode 230 (FIG. 2*b*) or both electrodes (the embodiment of FIG. 1*c* with an added memory material layer in between the electrodes). By constraining and/or reducing nucleation location to a very small dimension (e.g. nanometers), the filament size, number, or both can be reduced, thereby improving the functioning of the non-volatile memory cell by reducing the power necessary to reset the non-volatile memory cell to the high resistance state, render the power necessary to reset more constant, decrease the time necessary for resetting, or a combination thereof.

The components of such a non-volatile memory cell, such as the first electrode 210, the second electrode 230 and the electrical contact region 220 (with the exception of the material) are generally as discussed above. The electrical contact region 220 in such an embodiment can generally be made of any conductive material. In an embodiment, the electrical contact region 220 can be made of conductive metals, including but not limited to, gold (Au), silver (Ag), copper (Cu), platinum (Pt), tungsten (W), tantalum nitride (TaN), and titanium nitride (TiN). The particular conductive material that is being deposited can play a role in the deposition technique that is chosen. For example, in an embodiment where titanium nitride (TiN) is being utilized to form the electrical contact region ionized metal plasma (IMP) sputtering can be utilized. IMP sputtering can provide good coverage of sidewalls with titanium nitride.

Such embodiments also generally include a memory material layer 250 as depicted in FIGS. 2*a* and 2*b*. The memory material layer 250 can be made of the materials as discussed above with respect to the electrical contact region 220 made of memory material; and can generally include any non-volatile memory material. The memory material layer 250 can generally be disposed on or adjacent to the electrical contact region 220. In an embodiment, the memory material layer 250 can be disposed directly on or in contact with the electrical contact region 220.

In an embodiment, depicted in FIG. 2*a*, the electrical contact region 220 can be oriented so that the memory material layer 250 is disposed on or adjacent to the open end of the cavity (opposite the end portion 222). In an embodiment, the electrical contact region 220 can be oriented so that the memory material layer 250 is disposed directly on or in contact with the open end of the cavity (opposite the end portion 222). In such an embodiment, the end portion 222 of the electrical contact region 220 can be disposed on or adjacent to the first electrode 210 (e.g. the bottom electrode). In such an embodiment, the end portion 222 of the electrical contact region 220 can be disposed directly on or in contact with the first electrode 210 (e.g. the bottom electrode). In an embodiment, the end portion 222 (and the entire electrical contact region 220) can be materially indistinct from the first electrode 210, or stated another way can be made from the same material and/or deposited at the same time.

In an embodiment, depicted in FIG. 2b, the electrical contact region 220 can be oriented so that the memory material layer 250 is disposed on or adjacent to the bottom of the continuous side wall portion 221 or opposite the end portion 222 of the electrical contact region 220. In an embodiment, the electrical contact region 220 can be oriented so that the memory material layer 250 is disposed directly on or in contact with the bottom of the continuous side wall portion 221 of the electrical contact region 220. In such an embodiment, the end portion 222 of the electrical contact region 220 can be disposed on or adjacent to the second electrode 230 (e.g. the top electrode). In such an embodiment, the memory material layer 250 can be disposed directly on or in contact with the first electrode 210 (e.g. the bottom electrode).

Figure 3:
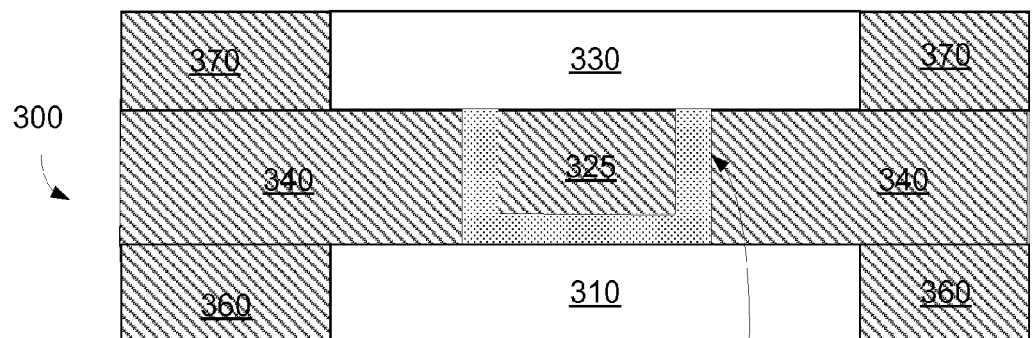
FIG. 3 is a cross sectional view of an embodiment of a non-volatile memory cell that includes an electrical contact region made of memory material.

FIG. 3 depicts another embodiment of a non-volatile memory cell 300 (components that are similar to those discussed above are numbered similarly). It will also be understood that the embodiment depicted in FIG. 3 could be modified by changing the orientation of the electrical contact region 320 so that the open end of the cavity 325 would be positioned on or adjacent to the first electrode 310 instead of the second electrode 330. The non-volatile memory cell 300 includes the components discussed above and also includes first insulating region 340. First insulating region 340 can generally function to insulate the electrical contact region 320 from other regions of the non-volatile memory cell 300, or its surroundings. Generally, first insulating region 340 can be made of any material that has electrical insulating properties. The first insulating region 340 can be made of any material that has electrical insulating properties and has a higher (or alternatively, substantially higher) breakdown voltage than the material of the memory material layer. In an embodiment, the first insulating region 340 can be made of dielectric materials such as alumina ($Al_2O_3$), silicon dioxide ($SiO_2$), and silicon nitride (SiN) for example. The first insulating region 340 also functions to electrically isolate the first electrode 310 from the second electrode 330 through all paths other than the electrical contact region 320.

The embodiment depicted in FIG. 3 also includes second insulating region 360 and third insulating region 370. Second insulating region 360 and third insulating region 370 can both function, alone or in combination to further electrically isolate the first electrode 310 from the second electrode 330 through all paths other than the electrical contact region 320. The second insulating region 360 and third insulating region 370 can also provide device to device isolation in a large array of devices on a single chip. The second insulating region 360 and third insulating region 370 can also function to electrically isolate the first electrode 310 and the second electrode 330 respectively from other portions of the non-volatile memory cell and the surroundings. The second insulating region 360 and third insulating region 370 can be made of any material that has electrical insulating properties, including, but not limited to, dielectric materials such as alumina ($Al_2O_3$), silica ($SiO_2$), and silicon nitride (SiN). The second insulating region 360 and third insulating region 370 can be coextensive with the first insulating region 340 or can be separate and/or distinct regions and/or materials. The second insulating region 360 (or the third insulating region 370 if the non-volatile memory cell had an opposite configuration) can also be part of an optional substrate.

In the embodiment depicted in FIG. 3, the electrical contact region 320 is memory material. In such an embodiment, the electrical contact region 320 provides the only electrical contact from the first electrode 310 to the second electrode 330 and also provides the material whose resistance changes in response to passing a current across the non-volatile memory cell. In the embodiment depicted in FIG. 3, the cavity 325 can be filled with an insulating material. The cavity 325 can be made of any material that has electrical insulating properties, including, but not limited to, dielectric materials such as alumina ($Al_2O_3$), silica ($SiO_2$), and silicon nitride (SiN).

Figure 4:
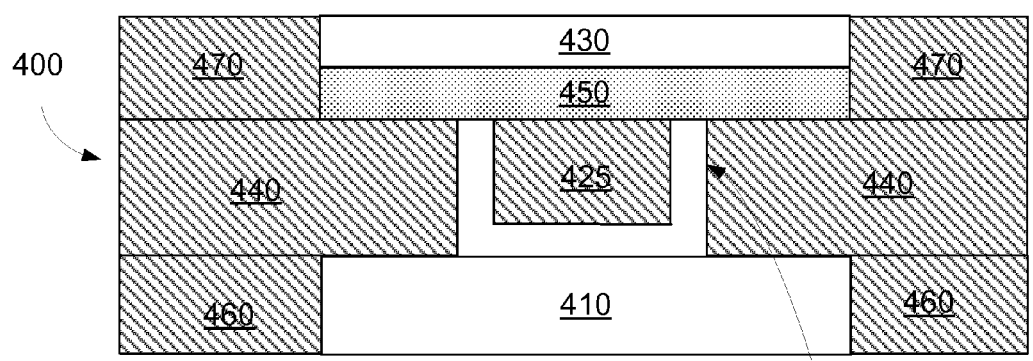
FIG. 4 is a cross sectional view of an embodiment of a non-volatile memory cell that includes a memory material layer and an electrical contact region made of conductive metal.

FIG. 4 depicts another exemplary embodiment of a non-volatile memory cell 400 as disclosed herein (components that are similar to those discussed above are numbered similarly). It will also be understood that the embodiment depicted in FIG. 4 could be modified by changing the orientation of the electrical contact region 420 so that the open end of the cavity 425 would be positioned on top of the memory material layer 450, which would be adjacent to or on the first electrode 410. The non-volatile memory cell 400 includes some of the components discussed above (including the first insulating region 440, the second insulating region 460, the third insulating region 470 and the cavity 425) and also includes memory material layer 450. As discussed above, the memory material layer 450 can generally be made of any type of non-volatile memory material. Also as discussed above, the second insulating region 460 and third insulating region 470 can be coextensive with the first insulating region 440, can be separate and/or distinct regions and/or materials.

In the embodiment depicted in FIG. 4, the electrical contact region 420 is a conductive material. In such an embodiment, the electrical contact region 420 can provide the only electrical contact from the first electrode 410 to the second electrode 430 or vice versa. The path from the first electrode 410 to the second electrode 430 goes through the memory material layer 450, thereby changing or measuring the resistance of the non-volatile memory cell 400.

Figure 5:
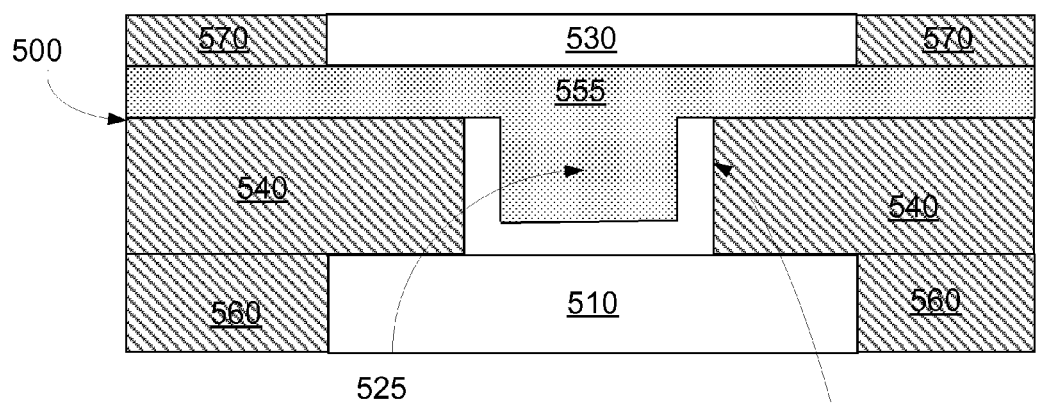
FIG. 5 is a cross sectional view of an embodiment of a non-volatile memory cell that includes a memory material layer and an electrical contact region made of conductive metal.

FIG. 5 depicts another exemplary embodiment of a non-volatile memory cell 500 as disclosed herein (components that are similar to those discussed above are numbered similarly). The non-volatile memory cell 500 includes some of the components discussed above (including the first insulating region 540, the second insulating region 560 and the third insulating region 570). As discussed above, the second insulating region 560 and third insulating region 570 can be coextensive with the first insulating region 540 or can be separate and/or distinct regions and/or materials.

The memory material layer 555 in the embodiment depicted in FIG. 5 is coextensive with memory material that fills the cavity 525 inside the electrical contact region 520. The memory material in the cavity 525 can generally be the same memory material as the remainder of the memory material layer 555 and in an embodiment can be deposited using the same step. The embodiment depicted in FIG. 5 generally functions in the same way as the embodiment in FIG. 4, in that the electrical contact region 520 provides electrical connection from the first electrode 510 through the memory material layer, more specifically, the portions of the memory material layer 555 positioned directly above or adjacent the top of the electrical contact region 520 to the second electrode 530. The thickness of the memory material layer 555 from the plane of the cavity 525 to the second electrode 530 is generally the effective memory layer thickness for filament formation. This area will generally have the highest electric fields during use of the non-volatile memory cell. In an embodiment, the effective memory layer thickness can be about 25 Å or more. In an embodiment, the effective memory layer thickness can be from about 25 Å to about 1000 Å.

Figure 6:
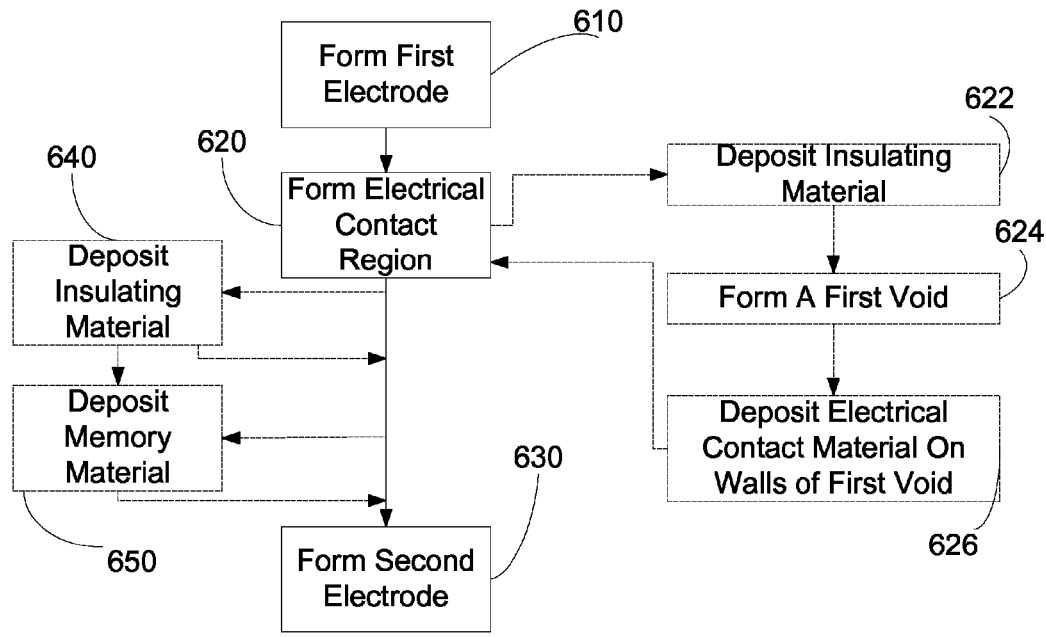
FIG. 6 is a flowchart illustrating exemplary methods of forming non-volatile memory cells.

Also disclosed herein are methods of making non-volatile memory cells. Exemplary methods are depicted in FIG. 6 and an article made using such an exemplary method is depicted at various stages throughout the process in FIGS. 7a through 7j (the figures do not necessarily depict the article at every stage of manufacture). Unless stated otherwise, materials can generally be deposited using methods and techniques commonly utilized, including but not limited to, physical vapor deposition (PVD), chemical vapor deposition (CVD), electrochemical deposition (ECD), molecular beam epitaxy (MBE) and atomic layer deposition (ALD) for example. Unless stated otherwise, materials can be patterned using methods and techniques commonly utilized, including but not limited to the use of photoresist techniques. Unless stated otherwise, materials can be etched using commonly utilized methods and techniques including, but not limited to chemical etching and chemical mechanical planarization (CMP).

The method shown in FIG. 6 begins with step 610, forming a first electrode. As discussed above, the first electrode can be formed on, partially in, or in a substrate. The substrate, if utilized, can include any substrate commonly utilized to fabricate memory devices. Exemplary substrates include, but are not limited to silicon, a mixture of silicon and germanium, and other similar materials. Generally, formation of the first electrode can be accomplished using techniques and processes commonly utilized.

Figure 7A:
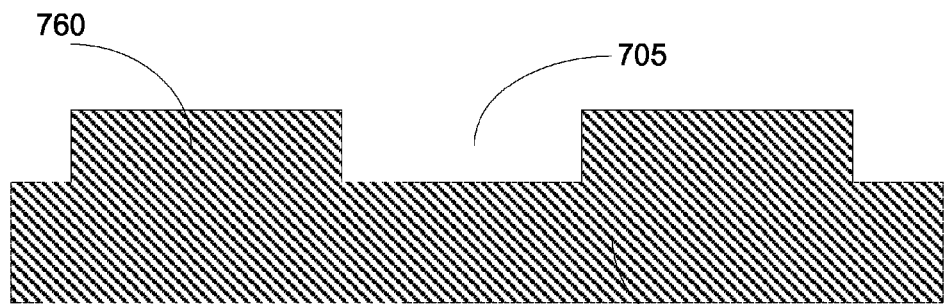
FIGS. 7a through 7j are cross sectional views of non-volatile memory cells at various stages of manufacture.

FIG. 7a illustrates an article during the step of forming an electrode. The article depicted in FIG. 7a includes an optional substrate 701 (which is not depicted in later figures), which has been patterned, forming second insulating region 760 and first electrode void 705. The material making up the second insulating region 760 can be part of the optional substrate 701 or could have been deposited thereon. The material making up the second insulating region 760, once deposited could then be patterned to form the first electrode void 705.

Figure 7B:
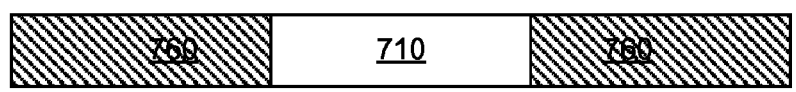

FIG. 7b illustrates the article after the first electrode 710 has been formed. Generally, after the first electrode void 705 was formed, commonly utilized techniques could be utilized to deposit the material of the first electrode. The first electrode 710 can be made of any conductive material, including but not limited to those including, tungsten (W), tantalum (Ta), gold (Au), platinum (Pt), palladium (Pd), rhodium (Rh), copper (Cu), Nickel (Ni), Silver (Ag), Cobalt (Co), Iron (Fe), or an alloy that includes one or more metal atoms, including but not limited to those disclosed here, or titanium nitride (TiN). Further techniques can also be utilized after deposition, including but not limited to CMP techniques.

In an alternative embodiment (not shown herein), the first electrode 710 can serve as a first electrode to a number of non-volatile memory cells on a substrate. In such an embodiment, a common layer of conductive material (including materials discussed above for the first electrode) can be deposited in a blanket film without patterning.

The next step in an exemplary method of forming a non-volatile memory cell includes step 620, forming an electrical contact region. Any step or sequence of steps can be utilized to form an electrical contact region. An exemplary optional sequence of steps is illustrated in FIG. 6 and includes step 622, depositing an insulating material, step 624, forming a first void and step 626, depositing electrical contact material on the surfaces of the first void. This sequence of steps (or other sequence of steps) can be carried out using known techniques to form an electrical contact region. FIGS. 7c through 7f depict exemplary steps that can be utilized to form an electrical contact region.

Figure 7C:
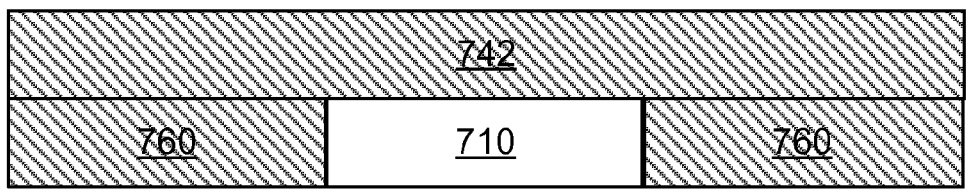
Figure 7D:
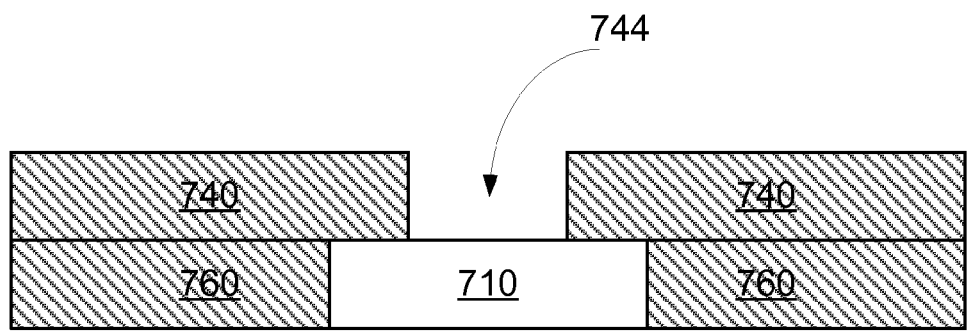

FIG. 7c shows an article after an insulating material has been deposited, which is step 622 in FIG. 6. The un-patterned insulating material 742 can be deposited using known techniques, as discussed above. The un-patterned insulating material 742 can include dielectric materials such as alumina ($Al_2O_3$) and silica ($SiO_2$) for example. In an embodiment, the un-patterned insulating material 742 can have a thickness from about 25 Å to about 500 Å. FIG. 7d shows the article after a first void was formed, which is step 624 in FIG. 6. This step was accomplished herein by patterning the un-patterned insulating material 742 to form the first insulating region 740 and the first void 744.

Figure 7E:
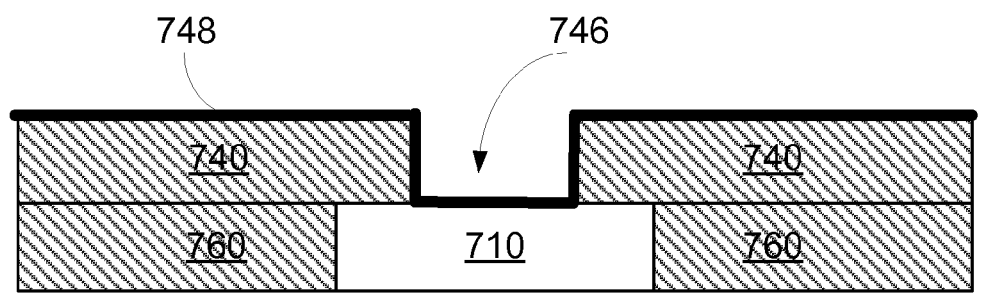

FIG. 7e shows an article after electrical contact material 748 has been deposited on the surfaces (e.g. the sides and bottom) of the first void 746, which is step 626. The article in FIG. 7e depicts an exemplary article where the electrical contact material was not only deposited on the surfaces of the first void 746 but was also deposited on all surfaces of the article. In an embodiment, the electrical contact material can be deposited only on the surfaces of the first void; on the surfaces of the first void and at least some of the surfaces of the article; or on the surfaces of the first void and substantially all of the surfaces of the article.

Generally, conformal deposition techniques can be utilized to deposit the electrical contact material. In an embodiment, the electrical contact material can be fabricated using techniques that can achieve good conformal sidewall deposition. The particular deposition technique to be used can be chosen based at least in part on the desired aspect ratio that is to be deposited into. Exemplary techniques include, but are not limited to, PVD, ionized plasma based sputtering, long throw sputtering, CVD and ALD. Generally, PVD techniques can achieve good conformal deposition for relatively small aspect ratio structures (1:1 or 1:2 for example), while ionized plasma based sputtering, long throw sputtering, CVD or ALD could be utilized for larger aspect ratios.

As discussed above, the electrical contact material can be a conductive metal or memory material. Generally the electrical contact material can be deposited in a similar way whether it is a conductive metal or memory material. The electrical contact material is generally deposited to a thickness from about 2 nm to about 50 nm. In an embodiment, the electrical contact material is deposited to a thickness from about 5 nm to about 50 nm.

Figure 7F:
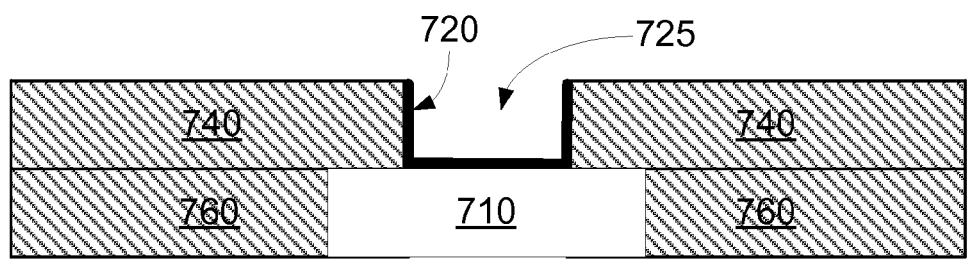

FIG. 7f shows the article after the electrical contact material 748 has been selectively removed from the surfaces of the article, leaving it only in the first void 746, thereby forming the electrical contact region 720; and the cavity 725 therein. An exemplary method of carrying out this processing step includes, but is not limited to, utilizing CMP.

Although not depicted in the FIG. 7 sequence, in embodiments such as that depicted in FIG. 1b, this step could be carried out to form a different configuration. For example, the region of the first void 744 could have insulating material contained thereon and the electrical contact material could then be deposited thereon. Further processing steps, such as CMP could also be utilized, if necessary to remove the electrical contact material from the surfaces of the first insulating region 740. Further processing, such as directional ion milling or masked etching, could then be carried out after such a step in order to obtain a configuration such as that seen in FIG. 1c.

Figure 7G:
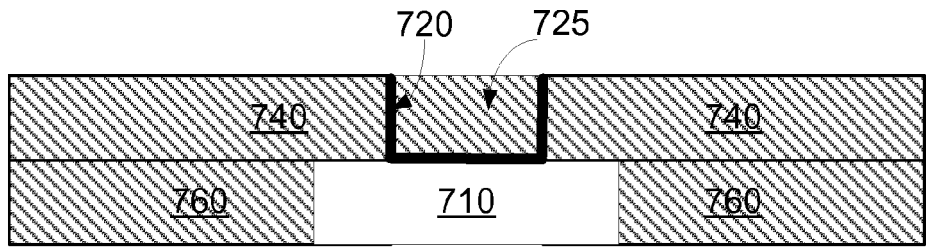

The methods depicted in FIG. 6 also includes optional step 640, depositing an insulating material. The insulating material can be deposited in the cavity 725 of the electrical contact region 720. In an embodiment, the cavity 725 can be filled in with material, such as insulating material. The insulating material in the cavity can be, but need not be the same as the insulating material utilized in different regions of the article. FIG. 7g shows the article after insulating material has been deposited into the cavity 725. CMP can be utilized again in order to obtain a flat top surface of the article. In an embodiment, the steps exemplified by the articles of FIGS. 7f and 7g could be combined and undertaken after the step of FIG. 7g in order to decrease processing steps involved in fabricating a device.

Figure 8A:
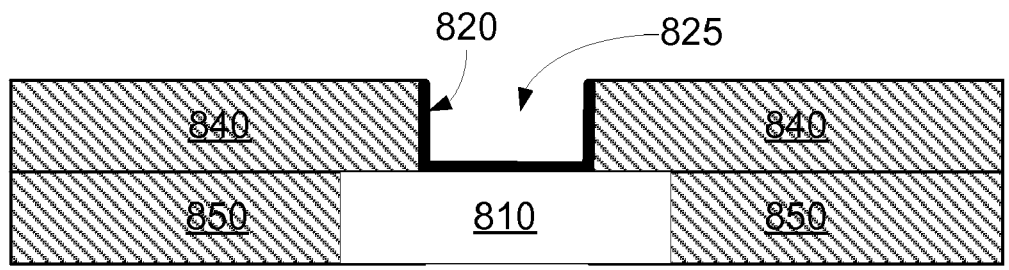
FIGS. 8a and 8b are cross sectional views of non-volatile memory cells at various stages of manufacture.
Figure 8B:
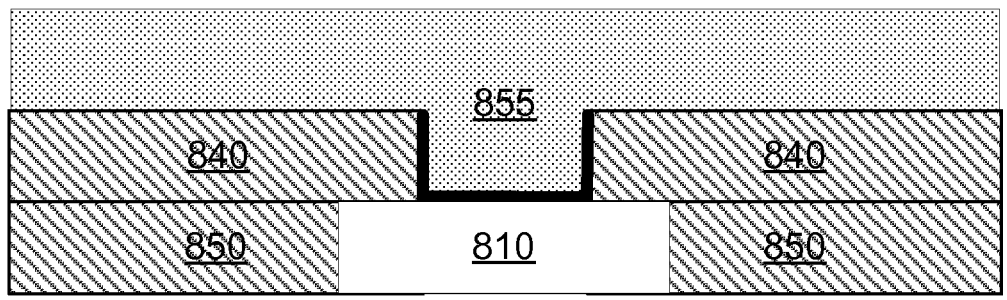

The methods depicted in FIG. 6 also depicted optional step 650, depositing memory material. In embodiments where the electrical contact region is made of a conductive metal, methods of fabricating non-volatile memory cells generally include an additional step, step 650, depositing memory material. FIG. 8a depicts an article after the electrical contact region 820 has been formed, for example, as exemplified above. FIG. 8b depicts the article after memory material 855 has been deposited. CMP can, but need not be utilized after the memory material layer 855 has been deposited.

Figure 9A:
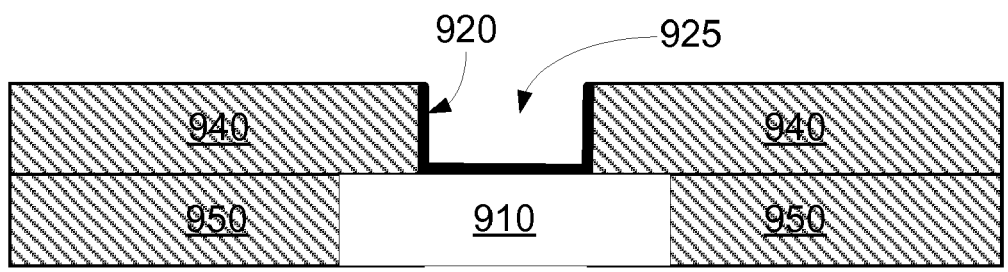
FIGS. 9a through 9c are cross sectional views of non-volatile memory cells at various stages of manufacture.
Figure 9B:
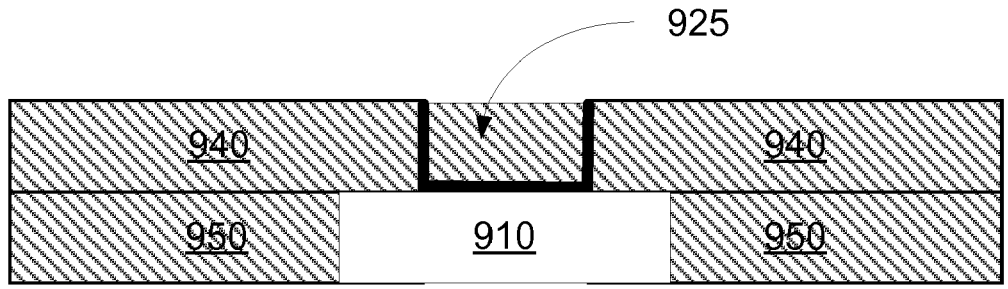
Figure 9C:
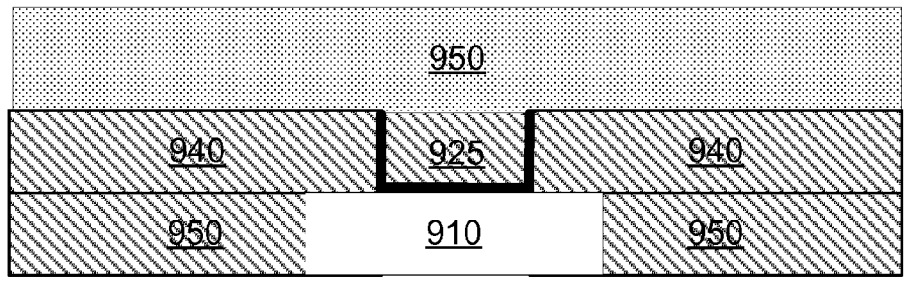

The methods depicted in FIG. 6 can also include both steps 640 and 650. Such a method could be utilized to fabricate a non-volatile memory cell having an electrical contact region that is made of a conductive metal. FIG. 9a depicts an article after the electrical contact region 920 has been formed, for example, as exemplified above. FIG. 9b depicts the article after insulating material has been deposited in the cavity 925; and FIG. 9c depicts the article after memory material layer 950 has been deposited.

Figure 7H:
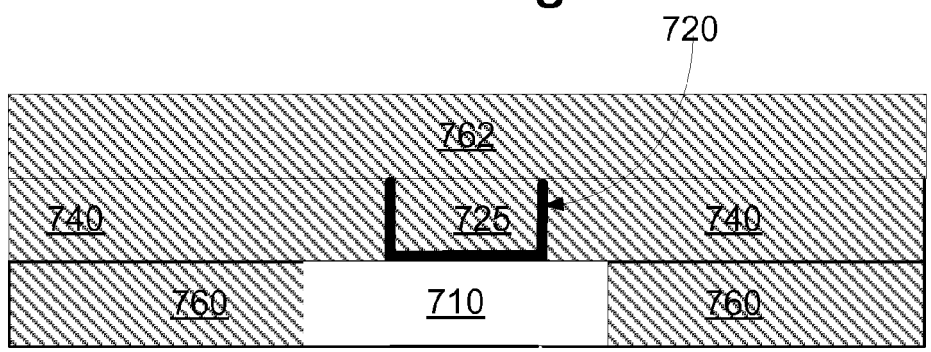
Figure 7I:
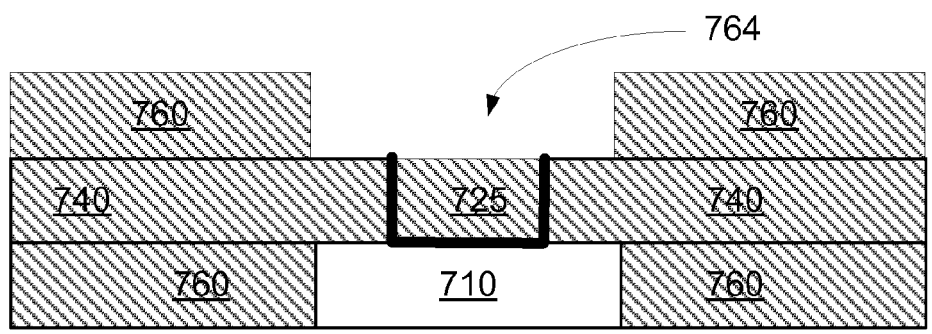
Figure 7J:
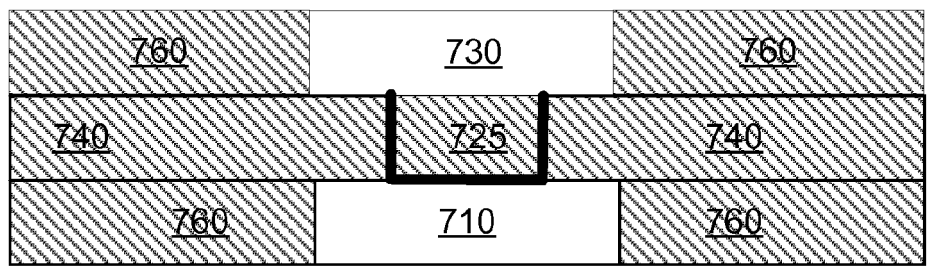

The next step in the exemplary method depicted in FIG. 6 includes step 630, formation of the second electrode. FIG. 7h shows an article after third insulating material 762 has been deposited; and FIG. 7i shows the article after third insulating material 762 has been patterned forming third insulating region 760 and second electrode void 764. FIG. 7j shows the article after second electrode material has been deposited into the second electrode void 764 to form the second electrode 730. In an alternative embodiment, this can also be achieved by first depositing the second electrode 730 on top of the electrical contact 720 and second insulation 740, and subsequently patterning the second electrode 730 using typical photoresist masking and etching or milling techniques. In this case, after patterning the top electrode 730, the third insulation layer 760 could be deposited and planarized using CMP. The article depicted in FIG. 7j is an example of a non-volatile memory cell with an electrical contact region 720 made of a memory material, and therefore, it need not have further memory material in the non-volatile memory cell.

Figure 10:
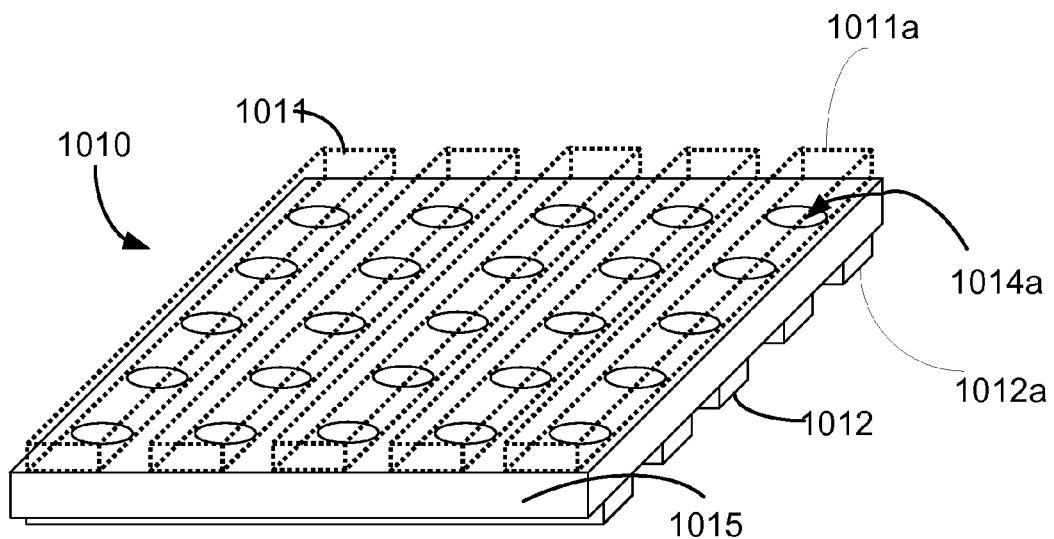
FIG. 10 is a perspective view of an illustrative memory array including non-volatile memory cells.

Also disclosed herein are memory arrays that include non-volatile memory cells as disclosed herein. FIG. 10 illustrates a generic array 1010 having a plurality of word lines 1011 and bit lines 1012 that may be orthogonal to word lines 1011. An exemplary word line 1011a and bit line 1012a are operatively connected to a non-volatile memory cell 1014a. The non-volatile memory cell 1014a may be part of a non-volatile memory cell structure 1015 which can include a plurality of non-volatile memory cells 1014, or can have a similar layered structure across the entirety of the non-volatile memory cell structure 1015, with non-volatile memory cells 1014 being defined only by the intersection of the word lines 1011 and the bit lines 1012. The exemplary memory array 1010 is a crosspoint array structure. A select device, such as diode or transistor, although not pictured in this figure, may be present at each crosspoint.

Non-volatile memory cells as disclosed herein can be included in stand alone devices or can be integrated or embedded in devices that utilize the RAM, including but not limited to microprocessors (e.g., computer systems such as a PC e.g., a notebook computer or a desktop computer or a server) microcontrollers, dedicated machines such as cameras, and video or audio playback devices.

Thus, embodiments of NANO-DIMENSIONAL NON-VOLATILE MEMORY CELLS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A non-volatile memory cell comprising:
   a first electrode;
   a second electrode;
   an electrical contact region that comprises a conductive metal and that electrically connects the first electrode and the second electrode, the electrical contact region has an end portion and a continuous side wall portion, and together, the end portion and the continuous side portion form an open cavity; and
   a memory material layer disposed between the second electrode and the electrical contact region
   wherein the memory cell has a high resistance state and a low resistance state that can be switched by applying a voltage across the first electrode and the second electrode.

2. The non-volatile memory cell according to claim 1, wherein the electrical contact region has a thickness from about 2 nm to about 50 nm.

3. The non-volatile memory cell according to claim 1, wherein the memory material is a filamentary resistive random access memory (RRAM) material.

4. The non-volatile memory cell according to claim 1, wherein the memory material layer comprises a phase change memory material.

5. The non-volatile memory cell according to claim 1, wherein the memory material layer comprises a programmable metallization cell material.

6. The non-volatile memory cell according to claim 1, wherein the first electrode comprises tungsten (W), tantalum (Ta), gold (Au), platinum (Pt), palladium (Pd), rhodium (Rh), copper (Cu), Nickel (Ni), Silver (Ag), Cobalt (Co), Iron (Fe), titanium nitride (TiN), ruthenium oxide ($RuO_2$), iridium oxide ($IrO_2$), indium tin oxide (ITO) or strontium ruthenate ($SrRuO_3$).

7. The non-volatile memory cell according to claim 1, wherein the second electrode comprises tungsten (W) or a noble metal such as gold (Au), platinum (Pt), palladium (Pd) or rhodium (Rh).

8. The non-volatile memory cell according to claim 1, wherein the memory material layer comprises chromium-doped strontium zirconate ($SrCr_xZr_{1-x}O_3$), chromium-doped strontium titanate ($SrCr_xTi_{1-x}O_3$), titanium doped nickel oxide ($Ti_xNi_{1-x}O$), copper oxides ($CuO_x$), silicon dioxide ($SiO_2$), hafnium oxide ($HfO_2$), undoped or doped zirconium oxide ($ZrO_2$), Titanium oxides ($TiO_x$), zinc oxide (ZnO), or gadolinium oxide ($Gd_2O_3$).

9. The non-volatile memory cell according to claim 1, wherein the memory material layer comprises germanium tellurium (GeTe), germanium sulfide (GeS), copper tellurium (CuTe), germanium selenide (GeSe), germanium antimonide (GeSb), or germanium antimony telluride (GST).

10. The non-volatile memory cell according to claim 1, wherein the electrical contact region comprises gold (Au), silver (Ag), copper (Cu), platinum (Pt), tungsten (W), tantalum nitride (TaN), or titanium nitride (TiN).

* * * * *